United States Patent
Wang et al.

(10) Patent No.: US 9,110,125 B2
(45) Date of Patent: Aug. 18, 2015

(54) METHOD AND APPARATUS FOR DETECTING RELATIONSHIP BETWEEN THERMAL AND ELECTRICAL PROPERTIES OF SEMICONDUCTOR DEVICE

(71) Applicants: Chien-Ping Wang, Hsinchu County (TW); Tzung-Te Chen, Taipei (TW); Pei-Ting Chou, Taipei (TW); Chun-Fan Dai, Kaohsiung (TW); Yi-Ping Peng, Miaoli County (TW)

(72) Inventors: Chien-Ping Wang, Hsinchu County (TW); Tzung-Te Chen, Taipei (TW); Pei-Ting Chou, Taipei (TW); Chun-Fan Dai, Kaohsiung (TW); Yi-Ping Peng, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 287 days.

(21) Appl. No.: 13/628,058

(22) Filed: Sep. 27, 2012

(65) Prior Publication Data

US 2014/0049283 A1 Feb. 20, 2014

(30) Foreign Application Priority Data

Aug. 14, 2012 (TW) .............. 101129424 A

(51) Int. Cl.
G01R 31/02 (2006.01)
G01R 31/26 (2014.01)
G01R 31/28 (2006.01)
G01R 31/30 (2006.01)

(52) U.S. Cl.
CPC ........ *G01R 31/2635* (2013.01); *G01R 31/2855* (2013.01); *G01R 31/3004* (2013.01)

(58) Field of Classification Search
None
See application file for complete search history.

(56) References Cited

U.S. PATENT DOCUMENTS

| | | | |
|---|---|---|---|
| 5,260,668 A | 11/1993 | Mallory et al. | |
| 7,759,962 B2 | 7/2010 | Shih et al. | |
| 7,952,368 B1 | 5/2011 | Dai et al. | |
| 7,982,475 B2 * | 7/2011 | Russell et al. | ........... 324/750.03 |
| 8,075,182 B2 | 12/2011 | Dai et al. | |
| 2009/0154525 A1 | 6/2009 | Dai et al. | |
| 2010/0327872 A1 * | 12/2010 | Chen et al. | .................... 324/414 |

FOREIGN PATENT DOCUMENTS

| | | |
|---|---|---|
| CN | 102221667 | 10/2011 |
| TW | 200925571 | 6/2009 |
| TW | 200938850 | 9/2009 |
| TW | I315399 | 10/2009 |
| TW | 201128201 | 8/2011 |
| TW | I355484 | 1/2012 |

OTHER PUBLICATIONS

Gordon Elger, et al., "Inline Thermal Transient Testing of High Power LED Modules for Solder Joint Quality Control", IEEE, Electronic Components and Technology Conference, 2011, pp. 1649-1656.

Jianzheng Hu, et al., "Mechanism and thermal effect of delamination in light-emitting diode packages", Microelectronics Journal, No. 38, 2007, pp. 157-163.

L.-R. Trevisanello, et al., "Thermal stability analysis of High Brightness LED during high temperature and electrical aging", Proc. of SPIE, vol. 6669, 2007, pp. 666913-1-666913-10.

Bin-Juine Huang, et al., "Thermal—electrical—luminous model of multi-chip polychromatic LED luminaire", Applied Thermal Engineering, No. 29, Jun. 6, 2009, pp. 3366-3373.

Adam Christensen, et al., "Thermal effects in packaging high power light emitting diode arrays Adam Christensen, Samuel Graham", Applied Thermal Engineering, No. 29, Mar. 17, 2009, pp. 364-371.

"Office Action of Taiwan Counterpart Application", issued on Oct. 28, 2014, p. 1-p. 7.

* cited by examiner

*Primary Examiner* — Minh N Tang

(74) *Attorney, Agent, or Firm* — Jianq Chyun IP Office

(57) ABSTRACT

A method for detecting a semiconductor device property is provided. First, a semiconductor device is provided. Thereafter, a detecting current is applied and the semiconductor device is heated, and temperatures and voltages of the semiconductor device are measured, so as to establish a relationship between the temperatures and the voltages of the semiconductor device. Accordingly, a temperature sensitive parameter (TSP) is calculated. An apparatus for detecting a semiconductor device property is also provided.

12 Claims, 14 Drawing Sheets

METHOD AND APPARATUS FOR DETECTING RELATIONSHIP BETWEEN THERMAL AND ELECTRICAL PROPERTIES OF SEMICONDUCTOR DEVICE

CROSS-REFERENCE TO RELATED APPLICATION

This application claims the priority benefit of Taiwan application serial no. 101129424, filed on Aug. 14, 2012. The entirety of the above-mentioned patent application is hereby incorporated by reference herein and made a part of this specification.

BACKGROUND

1. Technical Field

The technical field relates to a method and an apparatus for detecting a semiconductor device property.

2. Background

The known method for measuring the chip temperature or thermal resistance of a semiconductor device (e.g. light-emitting diode) is very time-consuming. In recent years, the heat flux per unit area of the device is continuously increasing. Therefore, how to accurately measure the chip temperature or thermal resistance of the device has been one of the main bases for determining the device lifetime and reliability.

According to the international standard method regulated by Joint Electron Device Engineering Council (JEDEC), for the measurement of the chip temperature and thermal resistance of a semiconductor device, it is required to obtain the relationship between voltages and temperatures of the device, which is also called a temperature sensitive parameter (TSP). The temperature sensitive parameter is obtained by measuring the device voltages at different equilibrium temperatures with a control device, so that a large amount of time cost is spent.

According to the stipulation, since significant amounts of resource and time are spent for the TSP measurement, the TSP is only measured by the manufacturer in the research and development (R&D) stage and serves as the specification of the R&D model of the product. However, the yield and stability issues are certainly present in the process. The manufacturer currently is not able to conduct a full or batch inspection for factory default devices, so that the semiconductor devices (e.g. light-emitting diodes) suffer from the low yield and insufficient reliability.

SUMMARY

One of exemplary embodiments comprises a method for detecting a semiconductor device property, and the method includes providing a semiconductor device; and applying a detecting current and heating the semiconductor device, and measuring temperatures and voltages of the semiconductor device, so as to establish a relationship between the temperatures and the voltages of the semiconductor device.

One of exemplary embodiments comprises an apparatus for detecting a semiconductor device property, and the apparatus includes a platen configured to support a semiconductor device; an electrical measurement unit configured to measure voltages of the semiconductor device; a temperature measurement unit configured to measure temperatures of the semiconductor device; a temperature controlling unit configured to control an atmosphere temperature around the semiconductor device; and a control unit configured to acquire at least two voltages and at least two temperatures of each die during a temperature rise, so as to establish a relationship between the voltages and the temperatures of each die.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
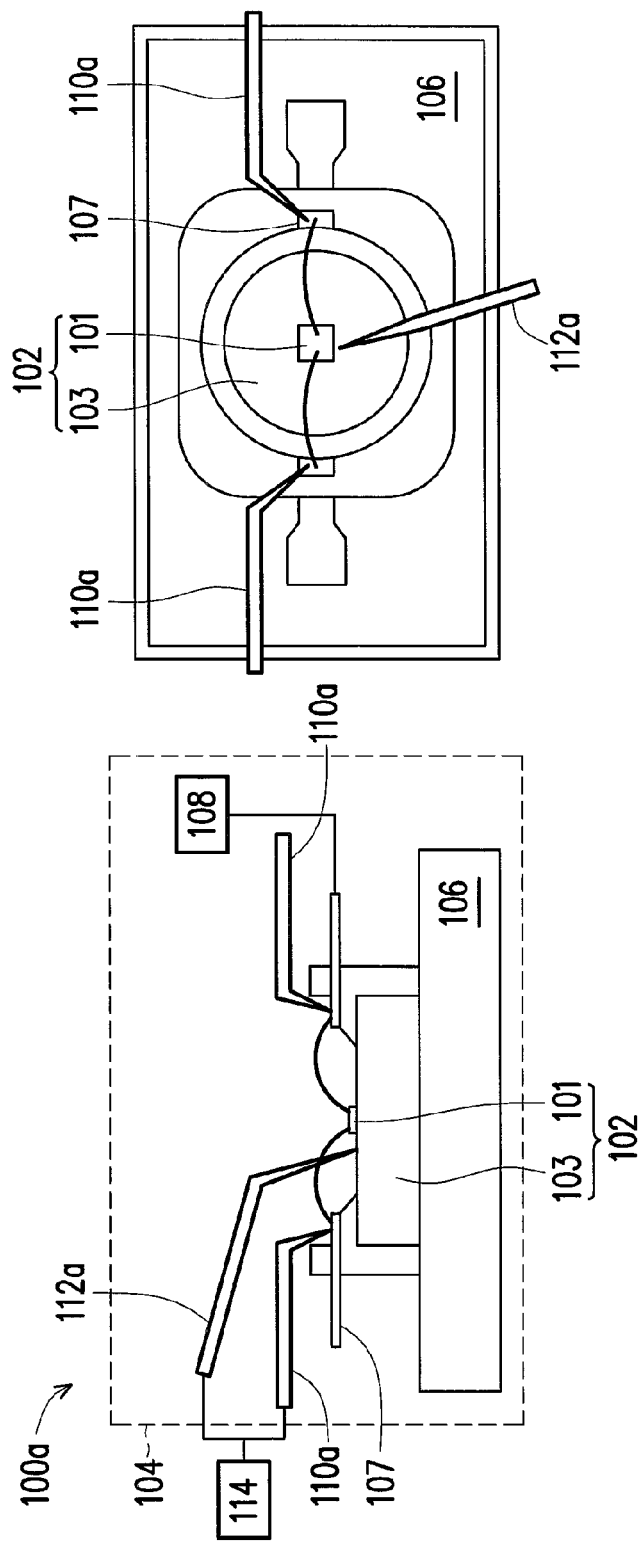
FIG. 1A to FIG. 1E each illustrate an apparatus for detecting a semiconductor property according to a different embodiment, wherein the left side is a cross-sectional view, and the right side is a top view.

A method for detecting a semiconductor device property and a detecting apparatus are provided herein, with which a temperature sensitive parameter (TSP) of a semiconductor device can be quickly obtained.

Various detecting apparatuses of exemplary embodiments are illustrated in the following. FIG. 1A to FIG. 1E each illustrate an apparatus for detecting a semiconductor property according to a different embodiment, wherein the left side is a cross-sectional view, and the right side is a top view.

Referring to FIGS. 1A-1D, each of the detecting apparatuses 100a-100d includes a temperature control unit 104, a platen 106, a current source 108, an electrical measurement unit, a temperature measurement unit and a control unit 114.

The platen 106 is configured to support a semiconductor device 102. The semiconductor device 102 is a package including a die 101 and a substrate 103. For example, the semiconductor device 102 can be a packaged light emitting diode device. The current source 108 is electrically connected to the semiconductor device 102 and provides a current to heat the device. In an embodiment, the current source 108 is electrically connected to the semiconductor device 102 through a lead frame and a wire, for example.

In an embodiment, the semiconductor device 102 can be placed in the temperature control unit 104, so that the atmosphere temperature around the semiconductor device 102 keeps stable. In another embodiment, the semiconductor device 102 can be placed and measured at room temperature (about 25° C.).

The electrical measurement unit and the temperature measurement unit are respectively configured to detect voltages and temperatures of the semiconductor device 102. The electrical measurement unit can be an electrical measurement probe, and the temperature measurement unit can be a temperature measurement probe or an infrared (IR) detector disposed above the package.

In the embodiment of FIG. 1A, an electrical measurement probe 110a is configured to measure a voltage at a pad 107 of the package, and a temperature measurement probe 112a is configured to measure a temperature at the substrate 103 of the package, for example.

Figure 1B:
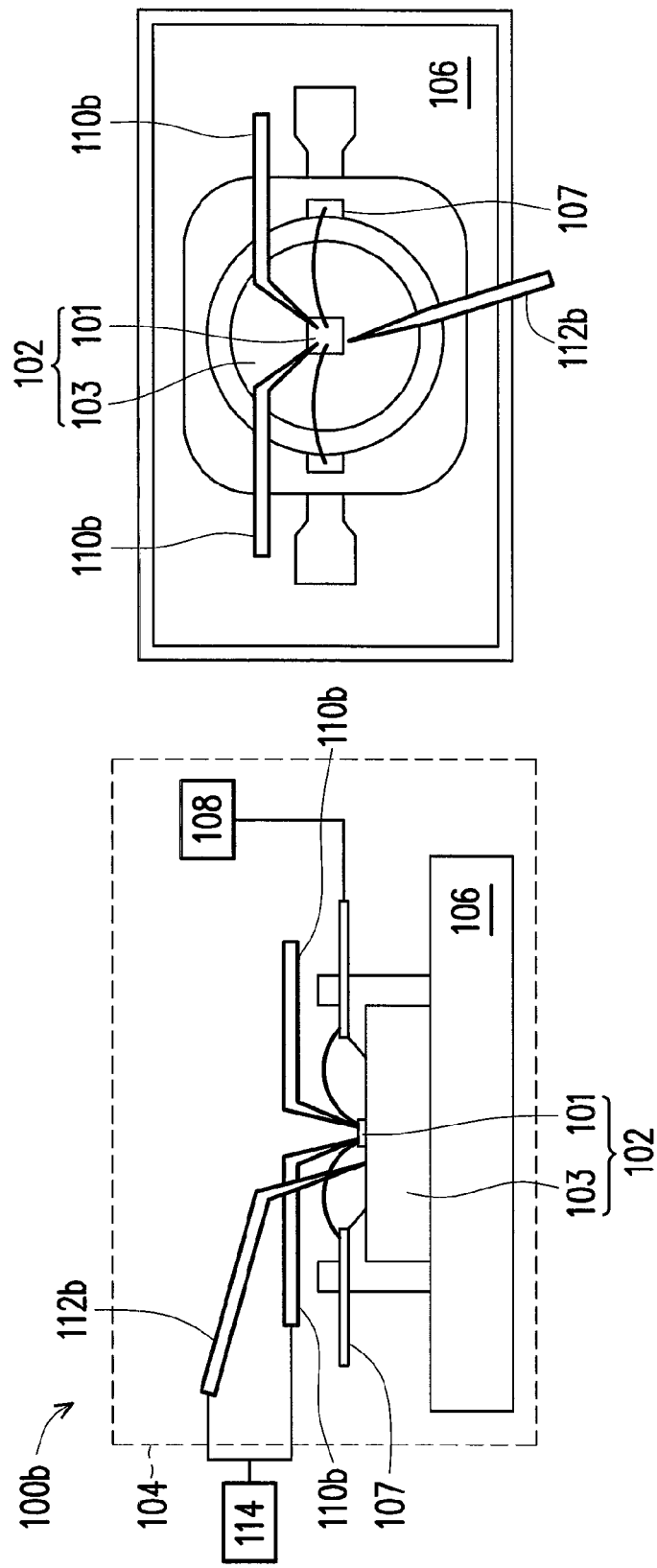

In the embodiment of FIG. 1B, an electrical measurement probe 110b is configured to measure a voltage at the die 101 of the package, and a temperature measurement probe 112b is configured to measure a temperature at the substrate 103 of the package, for example.

Figure 1C:
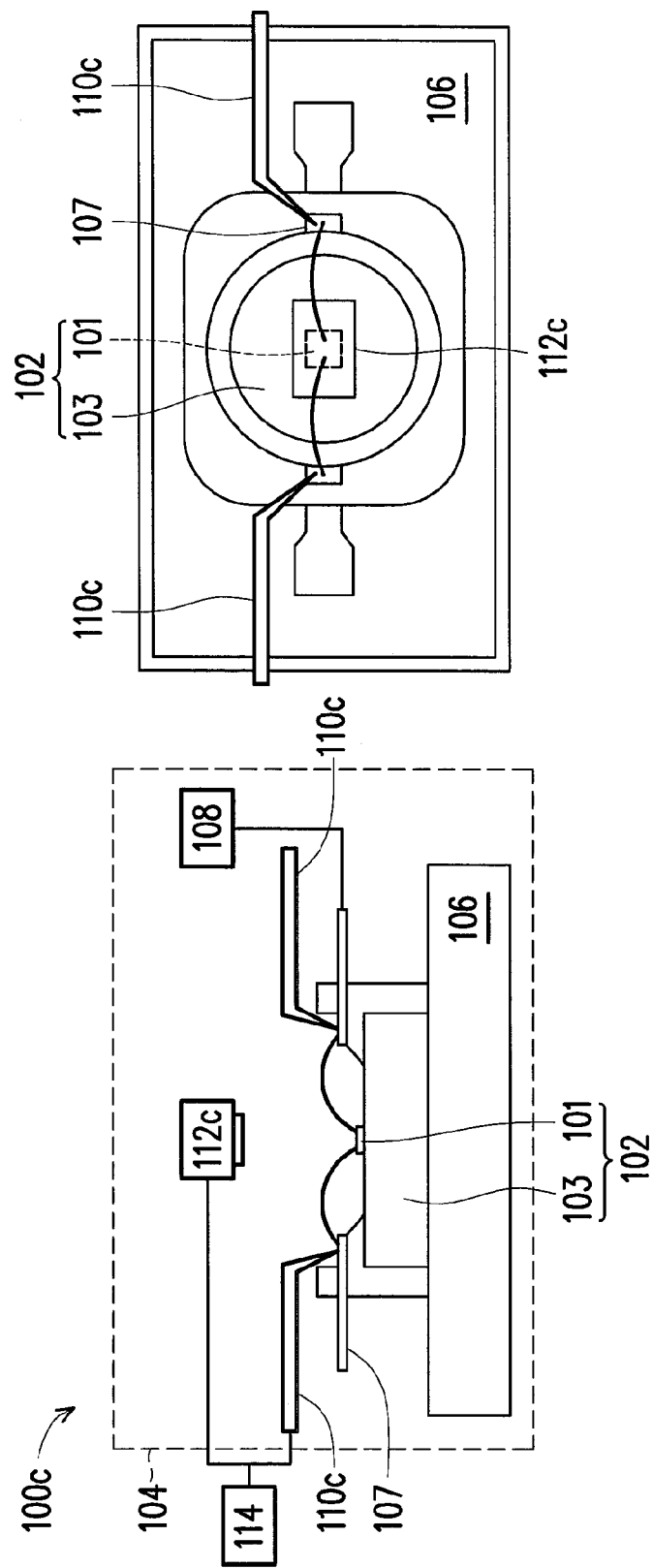

In the embodiment of FIG. 1C, an electrical measurement probe 110c is configured to measure a voltage at a pad 107 of the package, and an IR detector 112c is configured to measure a temperature of the package, for example.

Figure 1D:
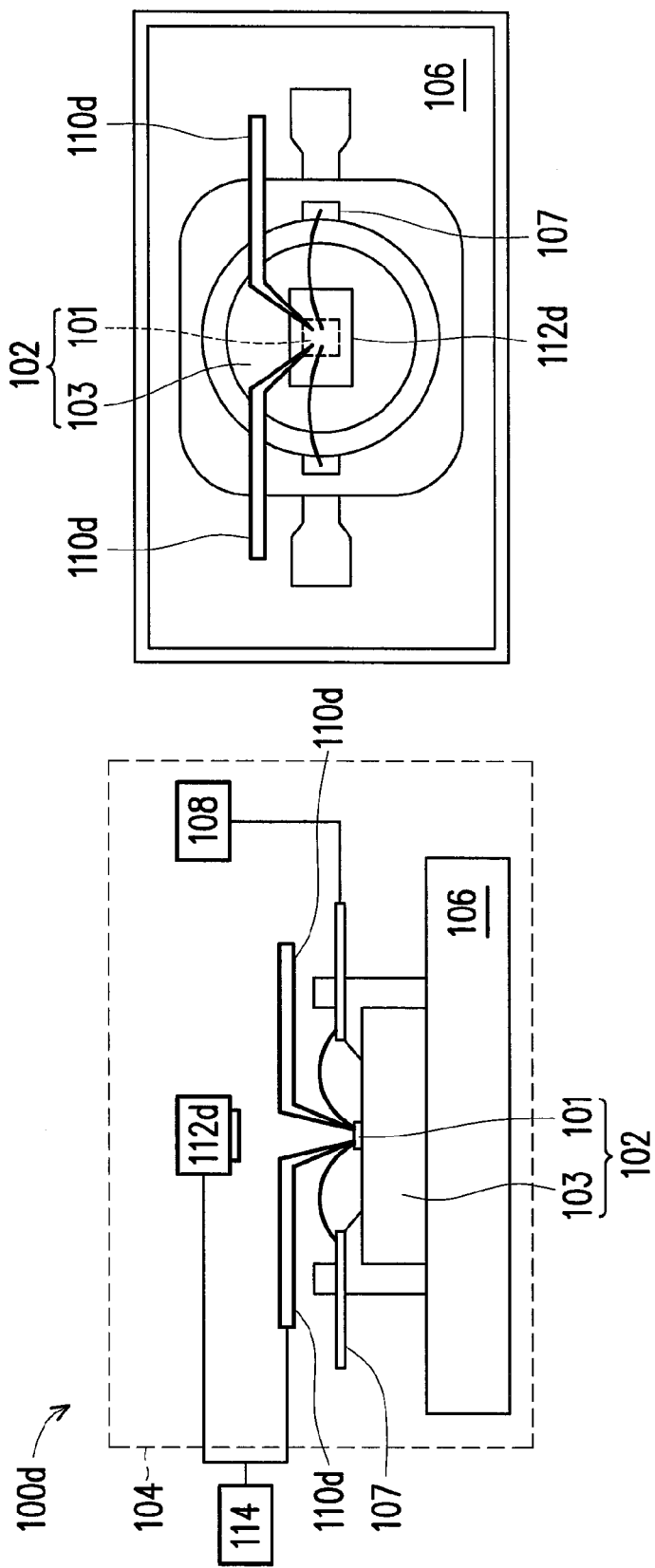

In the embodiment of FIG. 1D, an electrical measurement probe 110d is configured to measure a voltage at the die 101 of the package, and an IR detector 112d is configured to measure a temperature of the package, for example. However, the measurement sites for voltage and temperature measurements of the device are not limited herein, and can be other suitable sites known to people having ordinary skill in the art.

Besides, the electrical measurement unit and the temperature measurement unit can be other suitable detectors known to people having ordinary skill in the art. For example, the electrical measurement unit can be an electric meter, and the temperature measurement unit can be a thermocouple.

The control unit 114 is connected to the electrical measurement unit and the temperature measurement unit, so as to acquire at least two voltages and at least two temperatures of the semiconductor device 102 during a transient temperature rise, and therefore to establish a relationship between the temperatures and the voltages of the semiconductor device 102.

Figure 1E:
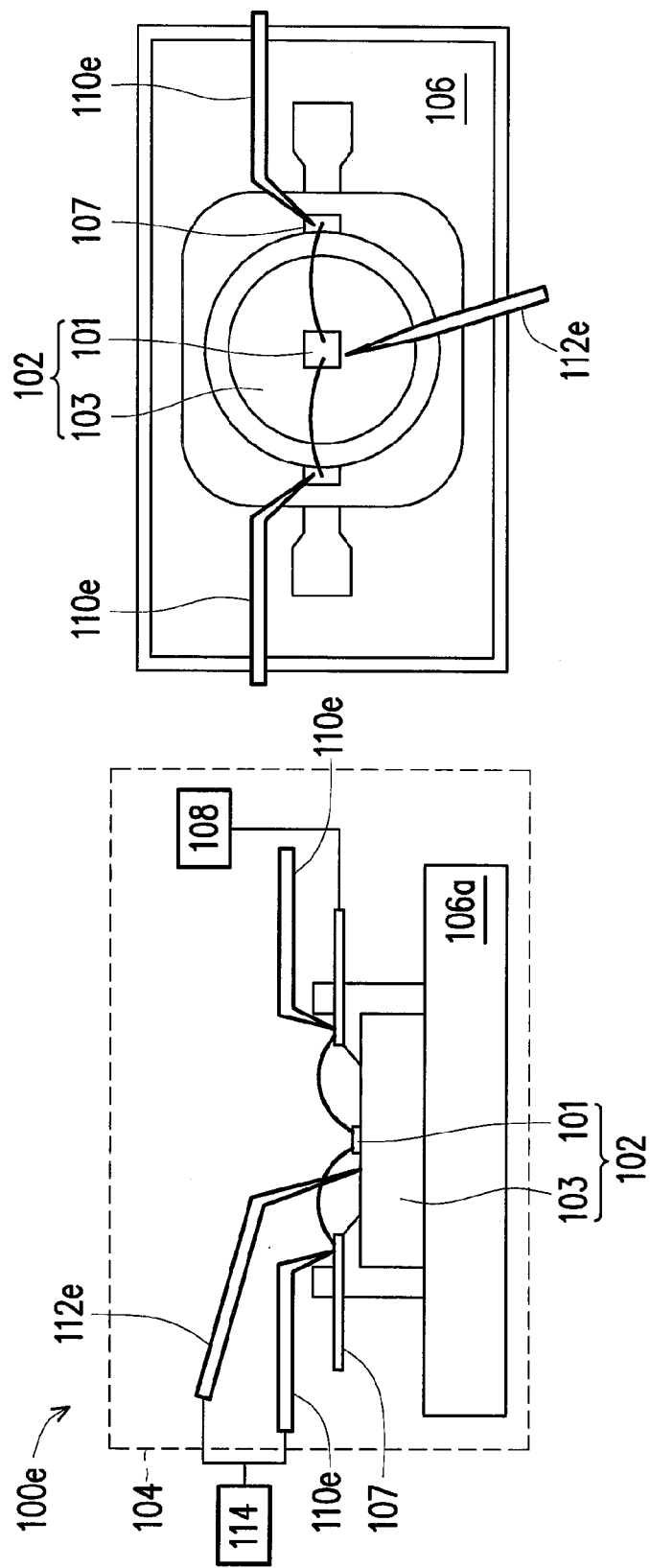

The said embodiments in which the platen 106 only has a support function are provided for illustration purposes, and are not construed as limiting the disclosure. In another embodiment, the platen can be a heating platen 106a with both support and heating functions, while the current source 108 provides a testing current (rather than a heating current) for the semiconductor device 102, as shown in FIG. 1E. An electrical measurement probe 110e and a temperature measurement probe 112e in FIG. 1E can be disposed with reference to the embodiment of FIG. 1A or another said embodiment.

The detecting apparatuses of FIGS. 1A-1E are provided for a packaged device, but the disclosure is not limited thereto. Other detecting apparatuses herein can be provided for an uncut device and are illustrated with reference to FIGS. 2A-2E. FIG. 2A to FIG. 2E each illustrate an apparatus for detecting a semiconductor property according to a different embodiment, wherein the left side is a cross-sectional view, and the right side is a top view.

Referring to FIGS. 2A-2E, each of detecting apparatuses 200a-200e includes a temperature control unit 204, a heating platen 206, a current source 208, an electrical measurement unit, a temperature measurement unit and a control unit 214.

The heating platen 206 is configured to support and heat a semiconductor device 202. The semiconductor device 202 is uncut and has a plurality of dies 201. The current source 208 is electrically connected to the semiconductor device 202, and the current source 208 provides a testing current (rather than a heating current) for the semiconductor device 202. In an embodiment, the current source 208 is electrically connected to semiconductor device 202 through the electrical measurement unit (e.g. an electrical measurement pin header or an electrical measurement probe), for example.

In an embodiment, the semiconductor device 202 can be placed in the temperature control unit 204, so that the atmosphere temperature around the semiconductor device 202 keeps stable. In another embodiment, the semiconductor device 202 can be placed and measured at room temperature (about 25° C.).

The electrical measurement unit and the temperature measurement unit are respectively configured to detect voltages and temperatures of the semiconductor device 202.

Figure 2A:
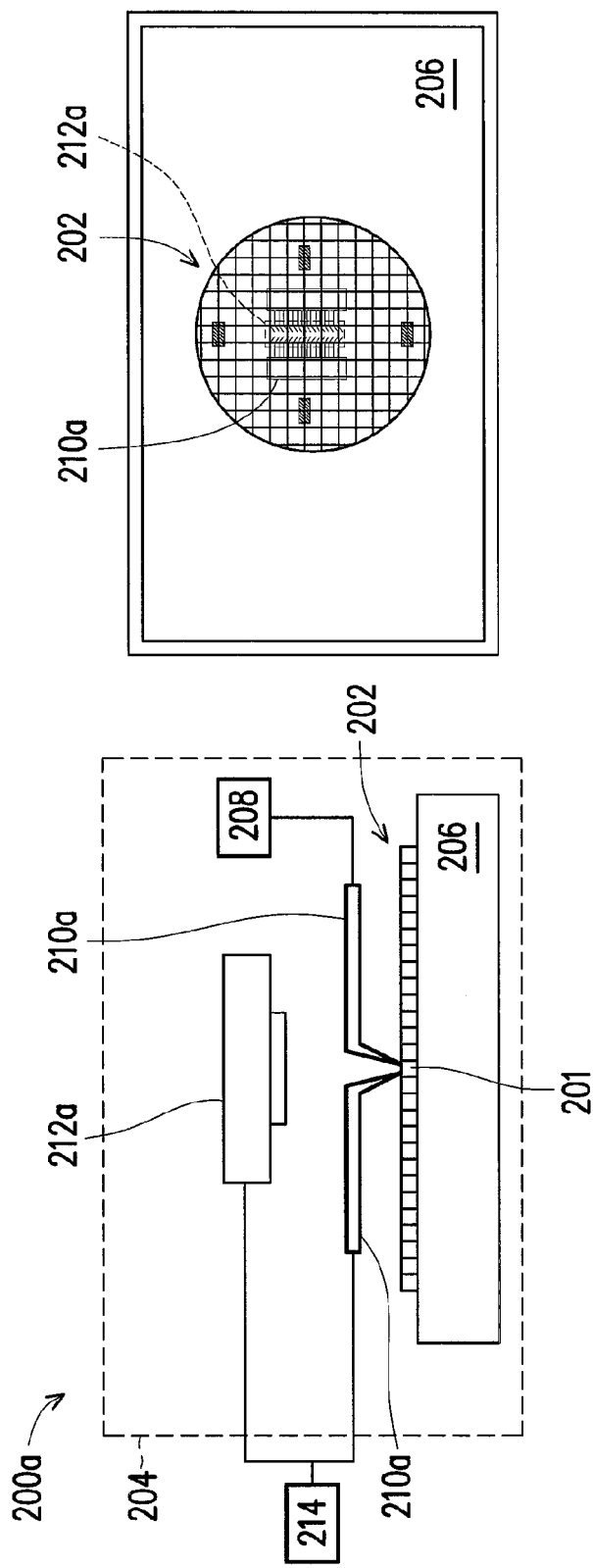
FIG. 2A to FIG. 2E each illustrate an apparatus for detecting a semiconductor property according to a different embodiment, wherein the left side is a cross-sectional view, and the right side is a top view.

In the embodiment of FIG. 2A, the electrical measurement unit is an electrical measurement pin header 210a, and the temperature measurement unit is an IR detector 212a disposed above the die to be measured, for example. The electrical measurement pin header 210a and the IR detector 212a can measure multiple dies 201 respectively at the same time.

Figure 2B:
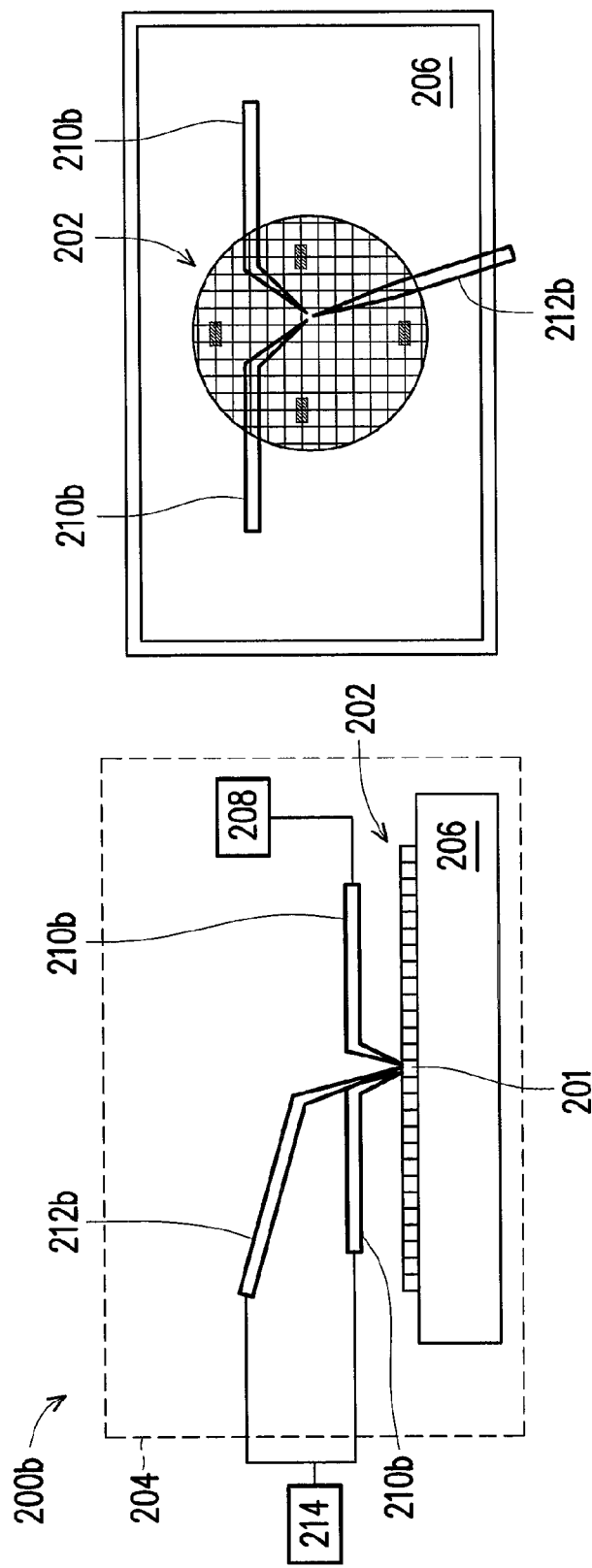

In the embodiment of FIG. 2B, the electrical measurement unit is an electrical measurement probe 210b, and the temperature measurement unit is a temperature measurement probe 212b, for example. The electrical measurement probe 210b and the temperature measurement probe 212b can measure the same die.

Figure 2C:
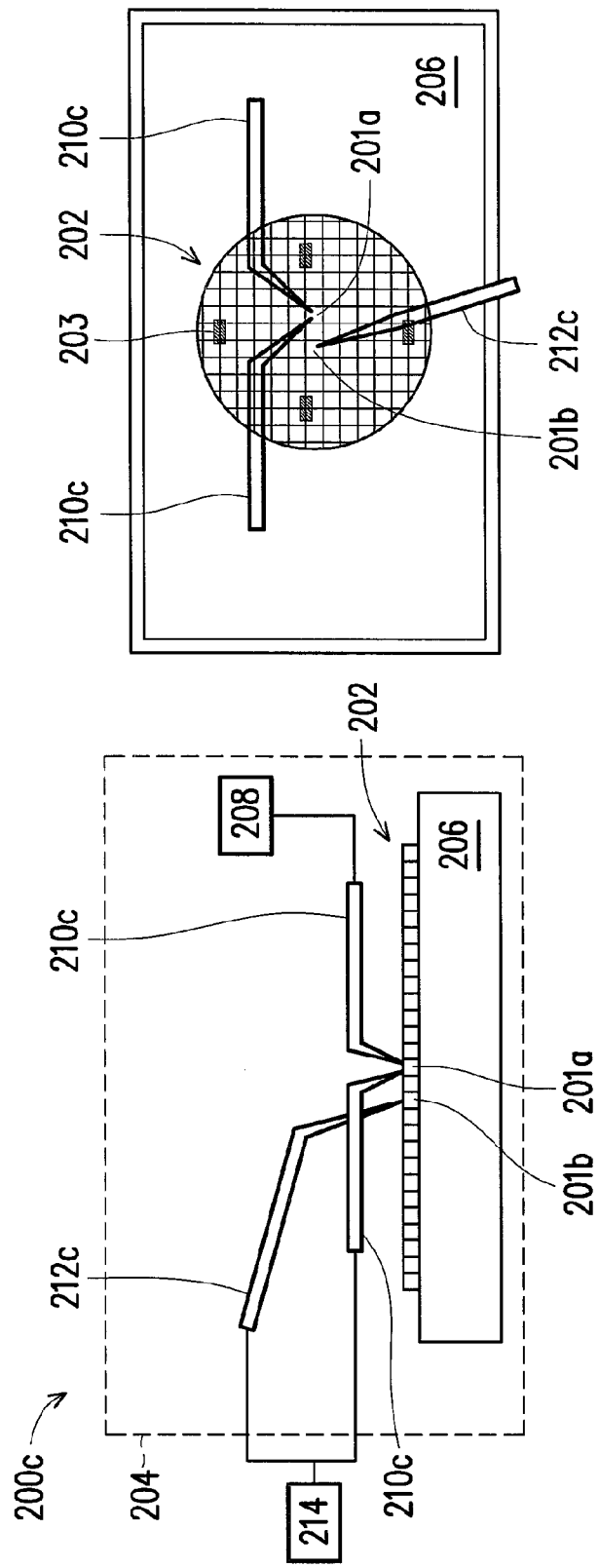

In the embodiment of FIG. 2C, the electrical measurement unit is an electrical measurement probe 210c, and the temperature measurement unit is a temperature measurement probe 212c, for example. The electrical measurement probe 210c measures a voltage of a die 201a, and the temperature measurement probe 212c measures a temperature of a die 201b which is near the die 201a. In an embodiment, the die 201b and the die 201a are separated from each other by at least one die. In another embodiment, the die 201b can be directly adjacent to the die 201a.

Figure 2D:
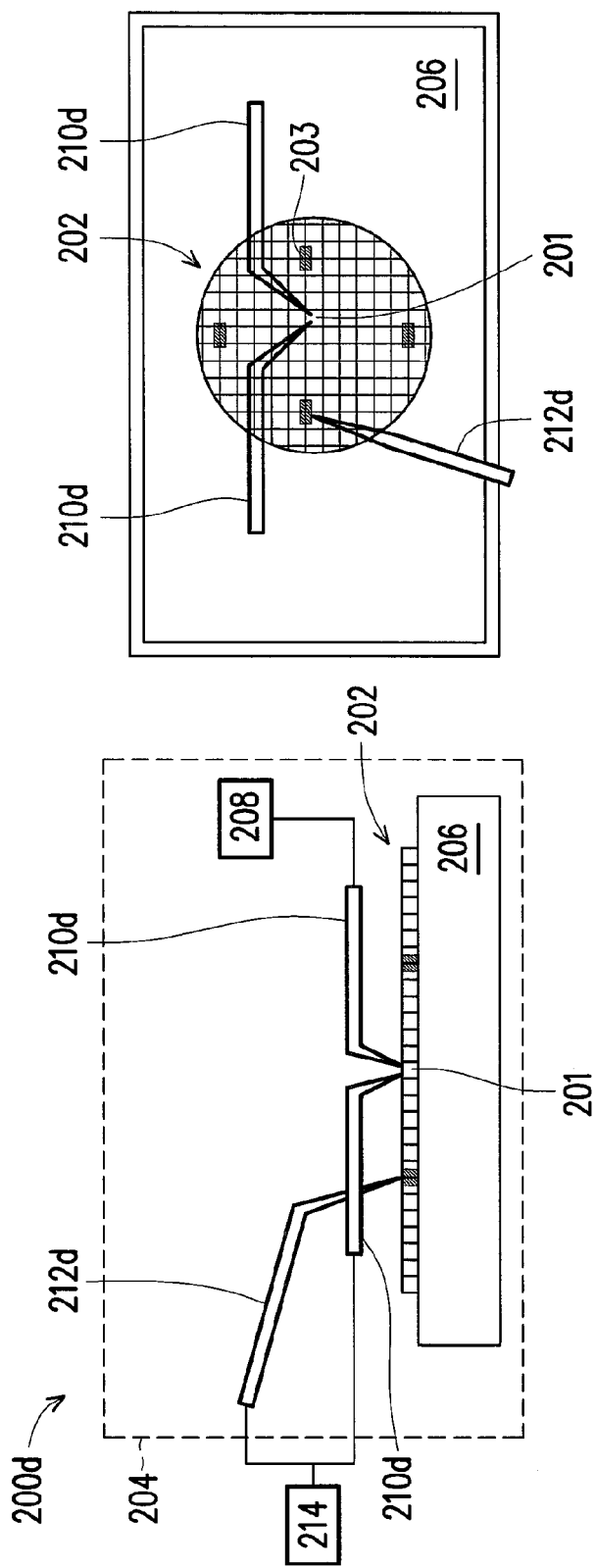

In the embodiment of FIG. 2D, the electrical measurement unit is an electrical measurement probe 210d, and the temperature measurement unit is a temperature measurement probe 212d, for example. The electrical measurement probe 210d measures a voltage of a die 201, and the temperature measurement probe 212d measure a temperature at an alignment mark 203.

The probe dispositions of FIG. 2C and FIG. 2D can prevent the temperature measurement unit from being affected by the light emitted from the light emitting diode. Specifically, when the light emitted from the light emitting diode is too intense, the results measured by the temperature measurement unit may be deviated. The semiconductor device 202 is placed on the heating platen 206, so that the temperature variation between the dies 201 can be neglected, and thus, the user can choose to measure the temperature at an adjacent die or an alignment mark so as to avoid the said issue.

Figure 2E:
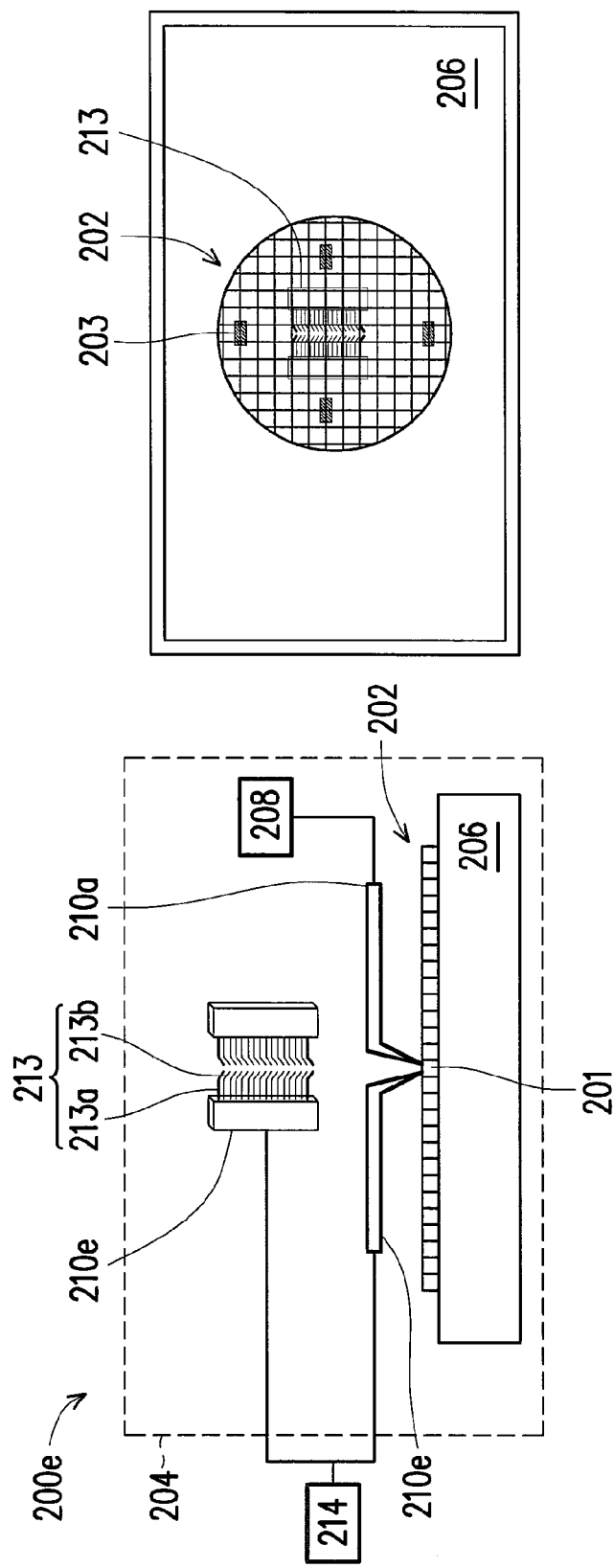

In yet another embodiment, the electrical measurement unit and the temperature measurement unit can be integrated into a composite pin header 213 for electrical and temperature measurements, as shown in FIG. 2E. The edge pins 231a of the composite pin header 213 can be temperature measurement probes, and multiple middle pins 213b constitute a voltage measurement pin header.

Besides, the electrical measurement unit and the temperature measurement unit can be other suitable detectors known to people having ordinary skill in the art. For example, the electrical measurement unit can be an electric meter, and the temperature measurement unit can be a thermocouple.

The control unit 214 is connected to the electrical measurement unit and the temperature measurement unit, so as to acquire at least two voltages and the corresponding temperatures of each die 201 during a temperature rise, and therefore to establish a relationship between the temperatures and the voltages of each die 201.

Figure 3:
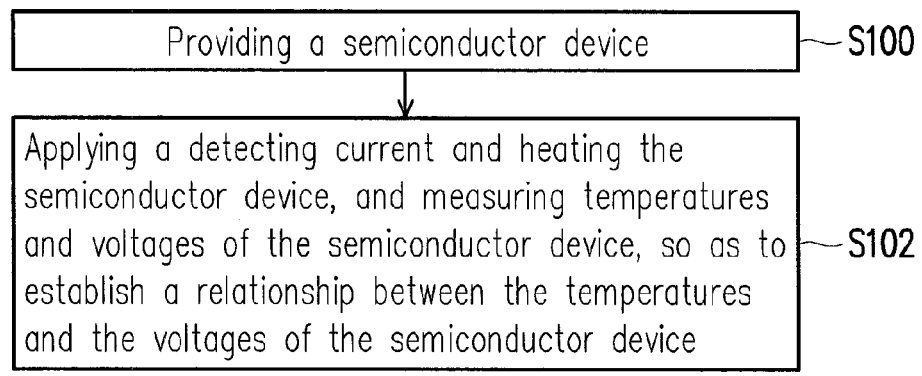
FIG. 3 illustrates a process flow of a method for detecting a semiconductor device property according to an embodiment.

FIG. 3 illustrates a process flow of a method for detecting a semiconductor device property according to an embodiment.

Referring to FIG. 3, a step S100 is performed to provide a semiconductor device. Thereafter, a step S102 is performed, in which a detecting current is applied and the semiconductor device is heated, and temperatures and voltages of the semiconductor device are measured, so as to establish a relationship between the temperatures and the voltages of the semiconductor device.

Methods for detecting a semiconductor device property of the disclosure are illustrated with reference to the said detecting apparatuses.

First Embodiment

Figure 4:
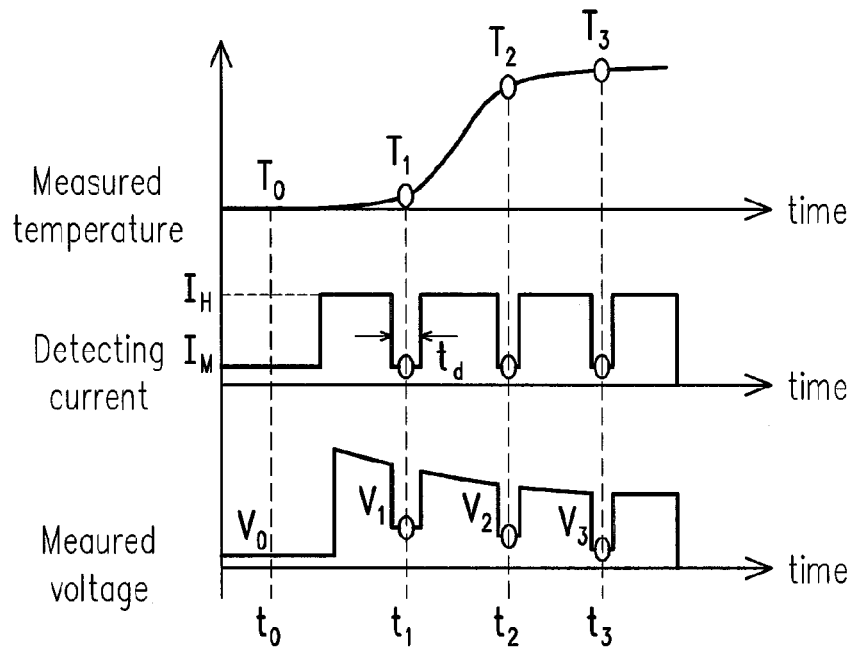
FIG. 4 illustrates a graph of voltage/temperature vs. time in a method for detecting a semiconductor device property according to a first embodiment.

FIG. 4 illustrates a graph of voltage/temperature vs. time in a method for detecting a semiconductor device property according to a first embodiment. The detecting method of the first embodiment can be conducted with either one of the detecting apparatuses of FIGS. 1A-1D. The detecting apparatus of FIG. 1A is taken as an example for conducting the detecting method of the first embodiment.

Referring to FIG. 1A and FIG. 4, a semiconductor device 102 is placed on a platen 106. The semiconductor device 102 is a packaged light emitting diode device, for example.

In an embodiment, the semiconductor device 102 can be placed in a temperature control unit 104, so that the atmosphere temperature around the semiconductor device 102 keeps stable. In another embodiment, the semiconductor device 102 can be placed and measured at room temperature.

Thereafter, a detecting current is applied to the semiconductor device 102 and the semiconductor device 102 is heated. The detecting current includes a heating current $I_H$ and a testing current $I_M$. The testing current $I_M$ can be firstly applied to the semiconductor device 102, and an initial voltage $V_0$ and an initial temperature $T_0$ of the semiconductor device at a time point $t_0$ are measured, as shown in FIG. 4. The testing current $I_M$ is generally from 0.1 mA to 10 mA, so as not to heat the device. Besides, the semiconductor device 102 is heated by the heating current from a current source 108.

The detecting current has a pulse waveform including the heating current $I_H$ and the testing current $I_M$ which are alternatively applied, as shown in FIG. 4. In an embodiment, the detecting current can be a pulse current. In another embodiment, the testing current $I_M$ can be constantly applied to the semiconductor device 102, and a DC current is applied along with an on/off switch, so as to generate the detecting current with the said current waveform.

In this embodiment, voltages and temperatures of the semiconductor device 102 are measured for a duration time $t_d$ of the testing current $I_M$. The duration time $t_d$ of the testing current $I_M$ is less than 300 μs, such as less than 50 μs, so as to avoid a temperature drop. In addition, the heating current $I_H$ is applied to heat the device without causing damage to the device. For example, the temperature range is generally between 25° C. and 300° C., such as between 25° C. and 200° C.

The temperatures and voltages of the semiconductor device 102 are measured during a transient temperature rise, so as to establish a relationship between the temperatures and the voltages of the semiconductor device. Specifically, an electrical measurement probe 110a and a temperature measurement probe 112a can be used to measure voltages $V_1$-$V_3$ and temperatures $T_1$-$T_3$ of the semiconductor device 102 respectively at time points $t_1$-$t_3$, as shown in FIG. 4. It is noted that in this embodiment, the respective temperatures and voltages of the semiconductor device are measured at respective low current levels $I_M$ rather than at respective high current levels $I_H$. A control unit 114 acquires at least two temperatures and at least two voltages of the device during a transient temperature rise. Thereafter, the measured voltages and the corresponding temperatures are plotted and a slope is then calculated. The slope is considered a temperature sensitive parameter (TSP) of the device.

Second Embodiment

Figure 5A:
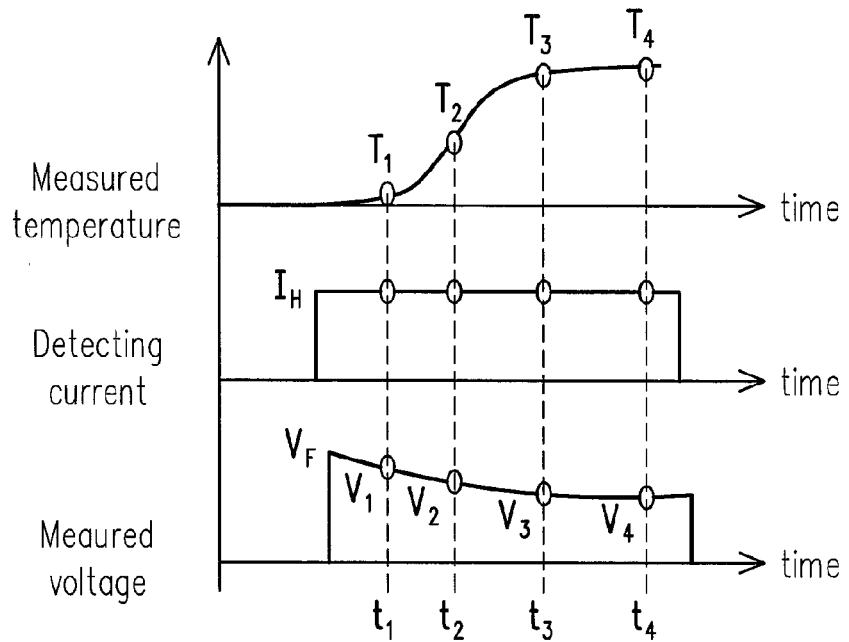
FIG. 5A to FIG. 5B each illustrates a graph of voltage/temperature vs. time in a method for detecting a semiconductor device property according to a second embodiment.
Figure 5B:
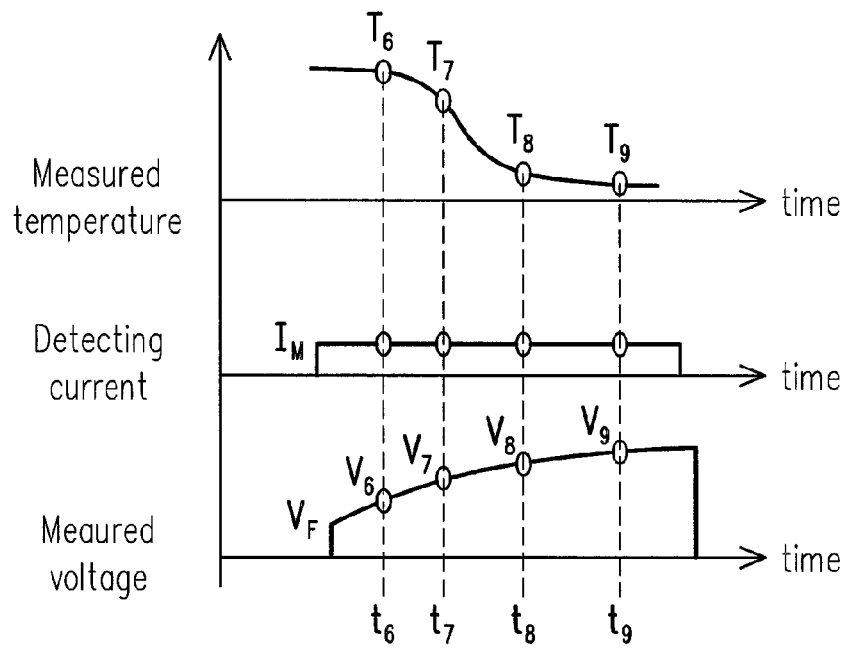

FIG. 5A to FIG. 5B each illustrates a graph of voltage/temperature vs. time in a method for detecting a semiconductor device property according to a second embodiment. The detecting method of the second embodiment can be conducted with either one of the detecting apparatuses of FIGS. 1A-1D. The detecting apparatus of FIG. 1A is taken as an example for conducting the detecting method of the second embodiment.

Referring to FIG. 1A and FIGS. 5A-5B, a semiconductor device 102 is placed on a platen 106. The semiconductor device 102 is a packaged light emitting diode device, for example. Besides, the semiconductor device 102 can be placed in a temperature control unit 104 or placed at room temperature for measurement.

Thereafter, a detecting current is applied and the semiconductor device 102 is heated, wherein a first half of the detecting current is a heating current, and a second half of the detecting current is a testing current $I_M$. The semiconductor device 102 is heated by the heating current from a current source 108, and the heating current has a waveform of a high current level $I_H$, as shown in FIG. 5A. In this embodiment, the high current level $I_H$ is greater than 10 mA. In an embodiment, the heating current can be a pulse current. In another embodiment, the heating current can be a DC current. In addition, the heating current is applied to heat the device without causing damage to the device. For example, the temperature range is generally between 25° C. and 300° C., such as between 25° C. and 200° C.

Afterwards, during a transient temperature rise, temperatures and voltages of the semiconductor device 102 are measured for a duration time of the heating current, so as to establish a first relationship between the temperatures and the voltages of the semiconductor device 102. Specifically, an electrical measurement probe 110a and a temperature measurement probe 112a can be used to measure voltages $V_1$-$V_4$ and temperatures $T_1$-$T_4$ of the semiconductor device 102 respectively at time points $t_1$-$t_4$, as shown in FIG. 5A. It is noted that in this embodiment, the temperatures and voltages of the semiconductor device 102 are measured at the high current level $I_H$, so as to establish the first relationship between the temperatures and the voltages of the semiconductor device 102.

In other words, a control unit 114 acquires at least two temperatures and at least two voltages of the device during a transient temperature rise. Thereafter, the measured voltages and the corresponding temperatures are plotted and a slope is then calculated. The slope is considered a heating temperature sensitive parameter (heating TSP) of the device.

After the first relationship is obtained, the heating current is turned off. During a transient temperature drop, temperatures and voltages of the semiconductor device 102 are measured for a duration time of the testing current $I_M$, so as to establish a second relationship between the temperatures and the voltages of the semiconductor device 102. The testing current $I_M$ is from 0.1 mA to 10 mA. Specifically, the electrical measurement probe 110a and the temperature measurement probe 112a can be used to measure voltages $V_5$-$V_8$ and temperatures $T_5$-$T_8$ of the semiconductor device 102 respectively at time points $t_5$-$t_8$, as shown in FIG. 5B. It is noted that in this embodiment, the temperatures and voltages of the semiconductor device 102 are measured at the low current level $I_M$, so as to establish the second relationship between the temperatures and the voltages of the semiconductor device 102.

In other words, the control unit 114 acquires at least two temperatures and at least two voltages of the device during a transient temperature drop. Thereafter, the measured voltages and the corresponding temperatures are plotted and a slope is then calculated. The slope is considered a cooling temperature sensitive parameter (cooling TSP) of the device.

Third Embodiment

Figure 6A:
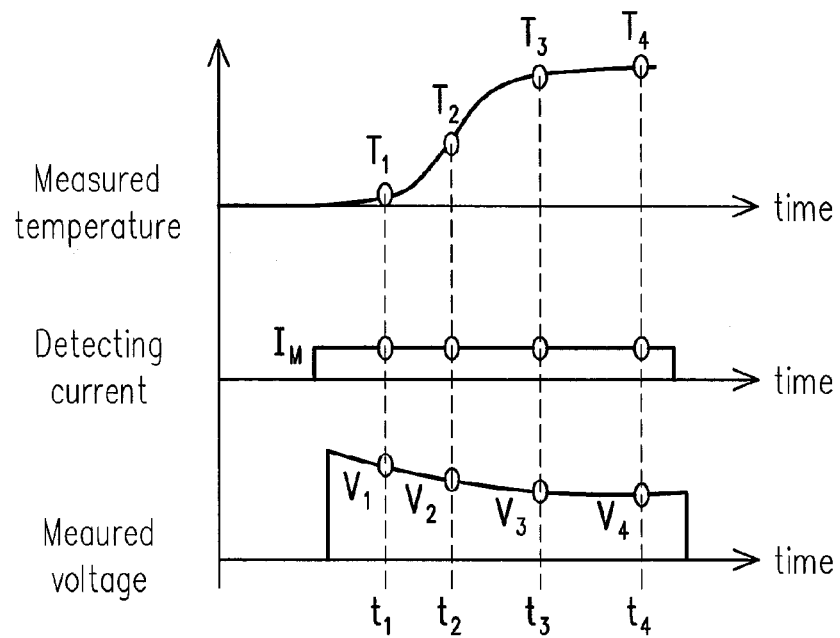
FIG. 6A to FIG. 6B each illustrates a graph of voltage/temperature vs. time in a method for detecting a semiconductor device property according to a third embodiment.
Figure 6B:
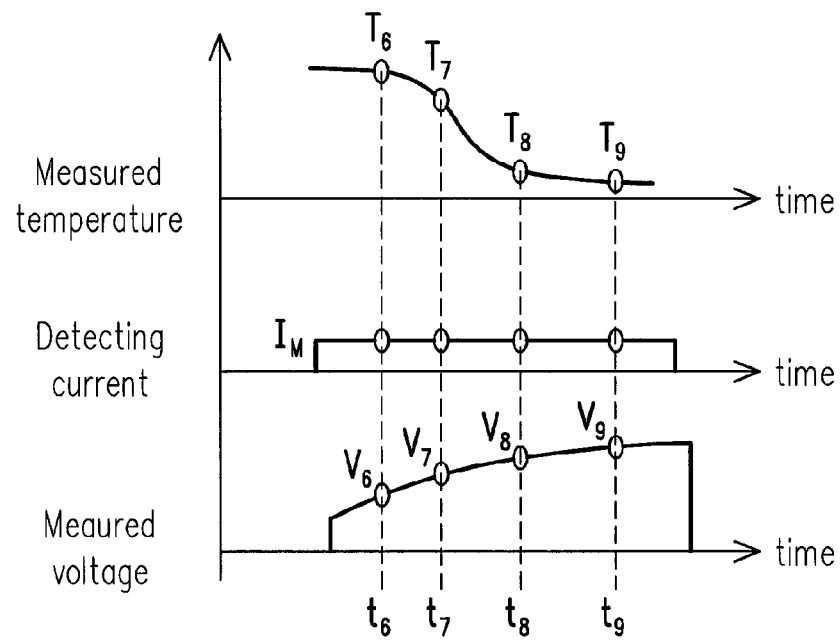

FIG. 6A to FIG. 6B each illustrate a graph of voltage/temperature vs. time in a method for detecting a semiconductor device property according to a third embodiment. The detecting method of the third embodiment can be conducted with the detecting apparatus of FIG. 1E.

Referring to FIG. 1E and FIGS. 6A-6B, a semiconductor device 102 is placed on a heating platen 106a.

Thereafter, the semiconductor device 102 is heated by the heating platen 106a. The semiconductor device 102 is a packaged light emitting diode, for example. Specifically, the semiconductor device 102 is placed on the heating platen 106a with a fixed temperature. Besides, the semiconductor device 102 can be placed in a temperature control unit 104 or placed at room temperature for measurement. In addition, the heating platen is provided to heat the device without causing damage to the device. For example, the temperature range is generally between 25° C. and 300° C., such as between 25° C. and 200° C.

Afterwards, a detecting current is applied and the semiconductor device 102 is heated, wherein the detecting current includes a testing current $I_M$. When the heating function of the heating platen 106a is turned on, the testing current $I_M$ is applied to the semiconductor device 102 during a transient temperature rise, and an electrical measurement probe 110e and a temperature measurement probe 112e can be used to measure voltages $V_1$-$V_4$ and temperatures $T_1$-$T_4$ of the semiconductor device 102 respectively at time points $t_1$-$t_4$, as shown in FIG. 6A. The testing current $I_M$ is from 0.1 mA to 10 mA.

In other words, a control unit 114 acquires at least two temperatures and at least two voltages of the device during a transient temperature rise. Thereafter, the measured voltages and the corresponding temperatures are plotted and a slope is then calculated. The slope is considered a heating temperature sensitive parameter (heating TSP) of the device.

After the first relationship is obtained, the heating function of the heating platen 106a is turned off. The testing current $I_M$ is applied to the semiconductor device 102 during a transient temperature drop, and the electrical measurement probe 110e and the temperature measurement probe 112e can be used to measure voltages $V_5$-$V_8$ and temperatures $T_5$-$T_8$ of the semiconductor device 102 respectively at time points $t_5$-$t_8$, as shown in FIG. 6B.

In other words, the control unit 114 acquires at least two temperatures and at least two voltages of the device during a transient temperature drop. Thereafter, the measured voltages and the corresponding temperatures are plotted and a slope is then calculated. The slope is considered a cooling temperature sensitive parameter (cooling TSP) of the device.

Fourth Embodiment

Figure 7:
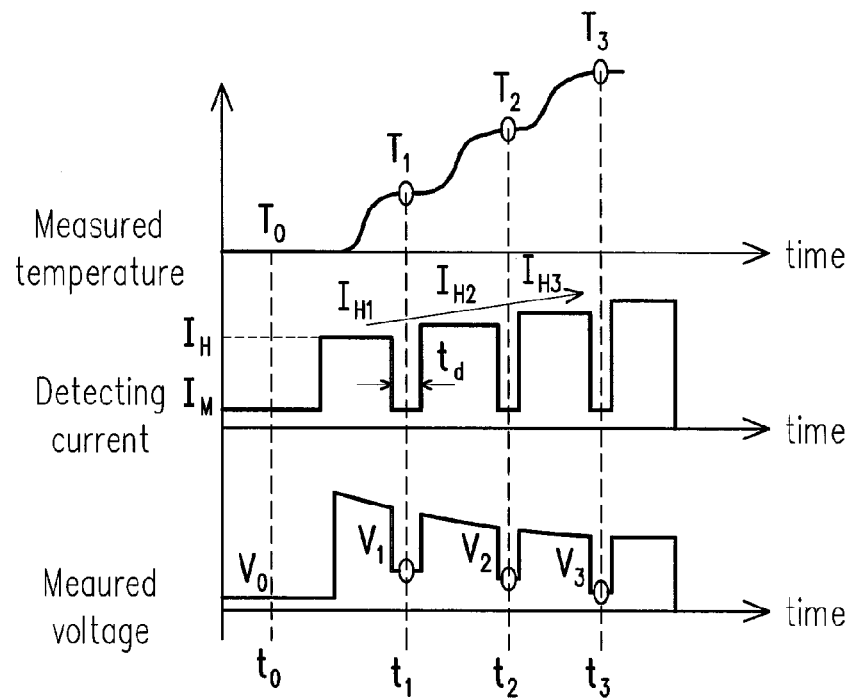
FIG. 7 illustrates a graph of voltage/temperature vs. time in a method for detecting a semiconductor device property according to a fourth embodiment.

FIG. 7 illustrates a graph of voltage/temperature vs. time in a method for detecting a semiconductor device property according to a fourth embodiment. The detecting method of the fourth embodiment can be conducted with either one of the detecting apparatuses of FIGS. 1A-1D. The detecting apparatus of FIG. 1A is taken as an example for conducting the detecting method of the fourth embodiment.

Referring to FIG. 1A and FIG. 7, a semiconductor device 102 is placed on a platen 106. The semiconductor device 102 is a packaged light emitting diode device, for example. Besides, the semiconductor device 102 can be placed in a temperature control unit 104 or placed at room temperature for measurement.

Thereafter, a detecting current is applied and the semiconductor device 102 is heated. The detecting current includes a heating current $I_H$ and a testing current $I_M$. The testing current $I_M$ can be firstly applied to the semiconductor device 102, and an initial voltage $V_0$ and an initial temperature $T_0$ of the semiconductor device at a time point $t_0$ are measured, as shown in FIG. 7. The testing current $I_M$ is generally from 0.1 mA to 10 mA, so as not to heat the device. Besides, the semiconductor device 102 is heated by the heating current from a current source 108.

The detecting current has a pulse waveform including the heating current $I_H$ and the testing current $I_M$ which are alternatively applied, wherein a pulse height of an $N^{th}$ pulse constituted by a current level of the heating current is lower than a pulse height of an $(N+1)^{th}$ pulse constituted by a current level of the heating current, and N is an integer greater than 1. The pulse heights of the pulses are at least greater than 10 mA, and are increased gradually over time. In addition, the heating current is applied to heat the device without causing damage to the device. For example, the temperature range is generally between 25° C. and 300° C., such as between 25° C. and 200° C.

Thereafter, in at least two thermal equilibrium states during a temperature rise, the corresponding voltages and temperatures of the semiconductor device 102 are measured for a duration time of the testing current $I_M$. Specifically, an electrical measurement probe 110a and a temperature measurement probe 112a can be used to measure voltages $V_1$-$V_3$ and temperatures $T_1$-$T_3$ of the semiconductor device 102 respectively at time points $t_1$-$t_3$, as shown in FIG. 7. It is noted that in this embodiment, the testing current $I_M$ is applied between a falling edge of the $N^{th}$ pulse and a rising edge of the $(N+1)^{th}$ pulse, and temperatures and voltages of the semiconductor device 102 are simultaneously measured, so as to establish a relationship between the temperatures and the voltages of the semiconductor device 102. The testing current $I_M$ is from 0.1 mA to 10 mA. The duration time $t_d$ of each testing current $I_M$ is less than 300 μs, such as less than 50 μs, so as to avoid a temperature drop.

In at least two thermal equilibrium states during a temperature rise, a control unit 114 correspondingly acquires at least two temperatures and at least two voltages of the device.

Thereafter, the measured voltages and the corresponding temperatures are plotted and a slope is then calculated. The slope is considered a temperature sensitive parameter (TSP) of the device.

Fifth Embodiment

Figure 8:
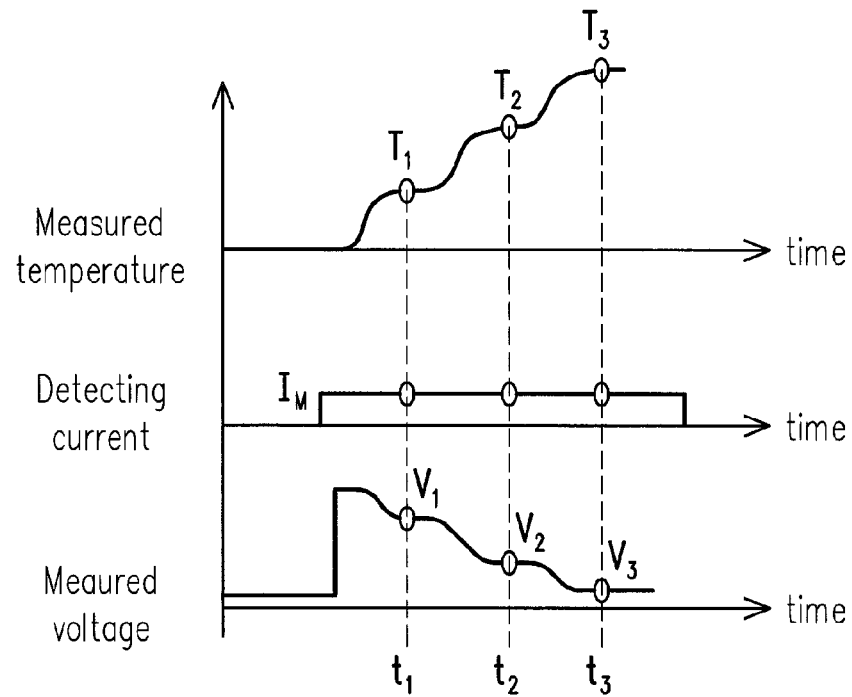
FIG. 8 illustrates a graph of voltage/temperature vs. time in a method for detecting a semiconductor device property according to a fifth embodiment.

FIG. 8 illustrates a graph of voltage/temperature vs. time in a method for detecting a semiconductor device property according to a fifth embodiment. The detecting method of the fifth embodiment can be conducted with either one of the detecting apparatuses of FIGS. 2A-2E. The detecting apparatus of FIG. 2A is taken as an example for conducting the detecting method of the fifth embodiment.

Referring to FIG. 2A and FIG. 8, a semiconductor device 202 is placed on a heating platen 206. The semiconductor device 202 is an uncut device, for example. Besides, the semiconductor device 202 can be placed in a temperature control unit 204 or placed at room temperature for measurement. In addition, the heating platen is provided to heat the device without causing damage to the device. For example, the temperature range is generally between 25° C. and 300° C., such as between 25° C. and 200° C.

Thereafter, in at least two thermal equilibrium states during a temperature rise in stages, the corresponding voltages and temperatures of the semiconductor device 202 are measured, so as to establish a relationship between the temperatures and the voltages of the semiconductor device 202. Specifically, in each thermal equilibrium state, the testing current $I_M$ is applied to the semiconductor device 202, and an electrical measurement pin header 210a and an IR detector 212a can be used to measure voltages $V_1$-$V_3$ and temperatures $T_1$-$T_3$ of the semiconductor device 102 respectively at time points $t_1$-$t_3$, as shown in FIG. 8. The testing current $I_M$ is from 0.1 mA to 10 mA.

In at least two thermal equilibrium states during a temperature rise, a control unit 114 correspondingly acquires at least two temperatures and at least two voltages of the device. Thereafter, the measured voltages and the corresponding temperatures are plotted and a slope is then calculated. The slope is considered a temperature sensitive parameter (TSP) of the device.

More specifically, in the fifth embodiment, the heating platen 206 is heated to a first temperature and keeps thermal equilibrium at the first temperature, and a full inspection is then performed to measure voltages and temperatures of each die of the semiconductor device 202. Thereafter, the heating platen 206 is heated from the first temperature to a second temperature and keeps thermal equilibrium at the second temperature, and another full inspection is then performed to measure voltages and temperatures of each die of the semiconductor device 202. The above steps are repeated multiple times. Thereafter, the measured voltages and the corresponding temperatures of each die are plotted and a slope is then calculated. The slope is considered a temperature sensitive parameter (TSP) of each die.

In summary, a method for detecting a semiconductor device property and a detecting apparatus are provided herein, with which a temperature sensitive parameter (TSP) of a semiconductor device can be quickly obtained. The detecting method and detecting apparatus can be applied to a packaged device or an uncut device. That is, both an uncut wafer and a device which has been cut and packaged can be detected. Besides, the detecting apparatus can be combined with the existing optical and electrical detecting apparatus, so as to significantly reduce the time cost, facilitate the production and meet the quality requirement.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for detecting a relationship between thermal and electrical properties of a semiconductor device, comprising:
providing a semiconductor device; and
heating the semiconductor device, and
synchronizing an electrical measurement unit and a temperature measurement unit to measure temperatures and voltages of the semiconductor device simultaneously during a temperature change, so as to establish a linear relationship between the temperatures and the voltages of the semiconductor device,
wherein the semiconductor device is heated by a heating current, and the temperatures and the voltages of the semiconductor device are measured during a transient temperature rise, so as to establish a first relationship between the temperatures and the voltages of the semiconductor device.

2. The method of claim 1, wherein the semiconductor device is a packaged device or comprises a plurality of uncut dies.

3. The method of claim 1, wherein the heating current is turned off, and the temperatures and the voltages of the semiconductor device are measured at a testing current during a transient temperature drop, so as to establish a second relationship between the temperatures and the voltages of the semiconductor device.

4. The method of claim 3, wherein a current level of the testing current is from 0.1 mA to 10 mA.

5. The method of claim 1, wherein a current level of the heating current is greater than 10 mA.

6. An apparatus for detecting a relationship between thermal and electrical properties of a semiconductor device, comprising:
a platen, configured to support a semiconductor device;
a current source, configured to apply a heating current;
an electrical measurement unit, configured to measure voltages of the semiconductor device;
a temperature measurement unit, configured to measure temperatures of the semiconductor device;
a temperature controlling unit, configured to control an atmosphere temperature around the semiconductor device; and
a control unit, configured to synchronize the electrical measurement unit and the temperature measurement unit when the semiconductor device is heated by the heating current, so as to measure the voltages and the temperatures simultaneously, and acquire at least two voltages and at least two temperatures of each die during a transient temperature rise, so as to establish a linear relationship between the voltages and the temperatures of each die.

7. The apparatus of claim 6, wherein the temperature measurement unit comprises an infrared (IR) detector, a temperature measurement probe or a thermocouple.

8. The apparatus of claim 6, wherein the semiconductor device is uncut and has a plurality of dies.

9. The apparatus of claim 8, wherein the electrical measurement unit comprises an electrical measurement pin header.

10. The apparatus of claim 8, wherein the electrical measurement unit and the temperature measurement unit are integrated into a composite pin header for electrical and temperature measurements.

11. The apparatus of claim 6, wherein the semiconductor device is a packaged device.

12. The apparatus of claim 11, wherein the electrical measurement unit comprises an electrical measurement probe.

* * * * *